(12) United States Patent  
Nakao

(10) Patent No.: US 8,308,049 B2
(45) Date of Patent: Nov. 13, 2012

(54) WIRE BONDING METHOD

(75) Inventor: Mitsuhiro Nakao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 12/556,918

(22) Filed: Sep. 10, 2009

(65) Prior Publication Data

US 2010/0096437 A1 Apr. 22, 2010

(30) Foreign Application Priority Data

Oct. 22, 2008 (JP) ................................ 2008-272414

(51) Int. Cl.
*B23K 1/06* (2006.01)
(52) U.S. Cl. ....................................... 228/110.1; 228/102
(58) Field of Classification Search ................ 228/110.1, 228/102
See application file for complete search history.

(56) References Cited

U.S. PATENT DOCUMENTS

| | | | | |
|---|---|---|---|---|
| 5,192,015 | A | * | 3/1993 | Ingle et al. .................... 228/111 |
| 5,994,212 | A | | 11/1999 | Arakawa et al. |
| 6,017,812 | A | * | 1/2000 | Yonezawa et al. ............ 438/613 |
| 6,105,848 | A | * | 8/2000 | Horibe et al. .............. 228/110.1 |
| 2003/0205607 | A1 | * | 11/2003 | Minamitani et al. ........... 228/1.1 |
| 2006/0097029 | A1 | * | 5/2006 | Kainuma et al. ............ 228/110.1 |
| 2012/0153444 | A1 | * | 6/2012 | Haga et al. ..................... 257/666 |

FOREIGN PATENT DOCUMENTS

| | | |
|---|---|---|
| JP | 11265913 | 9/1999 |
| JP | 2000216190 | 8/2000 |
| JP | 2004241712 | 8/2004 |
| JP | 2007201368 | 8/2007 |

OTHER PUBLICATIONS

Japanese Office Action for Japanese Application No. 2008-272414 mailed on May 7, 2012.
Japanese Office Action for Japanese Application No. 2008-272414 mailed on Jun. 4, 2012.

* cited by examiner

*Primary Examiner* — Nicholas D'Aniello
(74) *Attorney, Agent, or Firm* — Turocy & Watson, LLP

(57) ABSTRACT

A bonding method of applying vibrations to a metal unit including copper while pressing the metal unit onto a bonding object to bond the metal unit to the bonding object is provided. The method includes: applying vibrations to the metal unit and bringing the metal unit into contact with the bonding object while applying the vibrations; gradually increasing a pressing load of the metal unit on the bonding object to a first pressing load; and reducing the pressing load to a second pressing load smaller than the first pressing load and gradually increasing an output power of the vibrations from a first output power to a second output power after the pressing load reaches the first pressing load, the first output power being applied during the first pressing load.

10 Claims, 9 Drawing Sheets

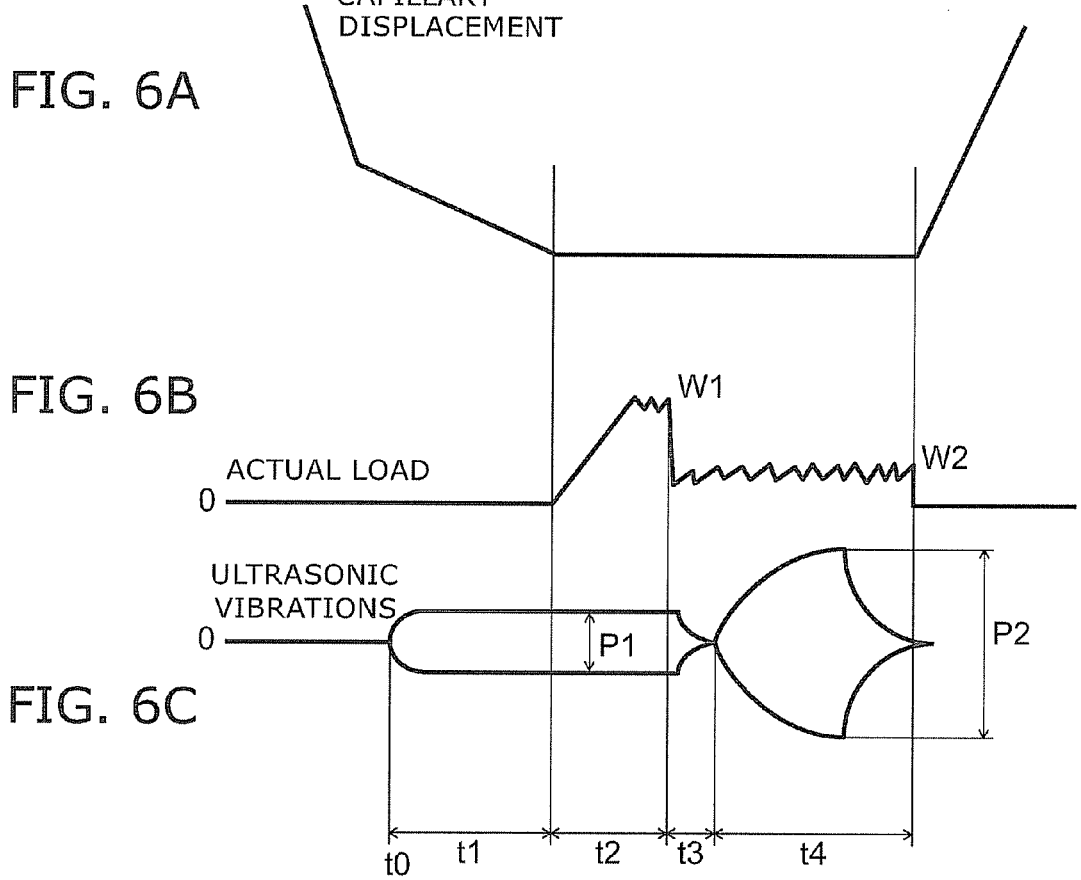

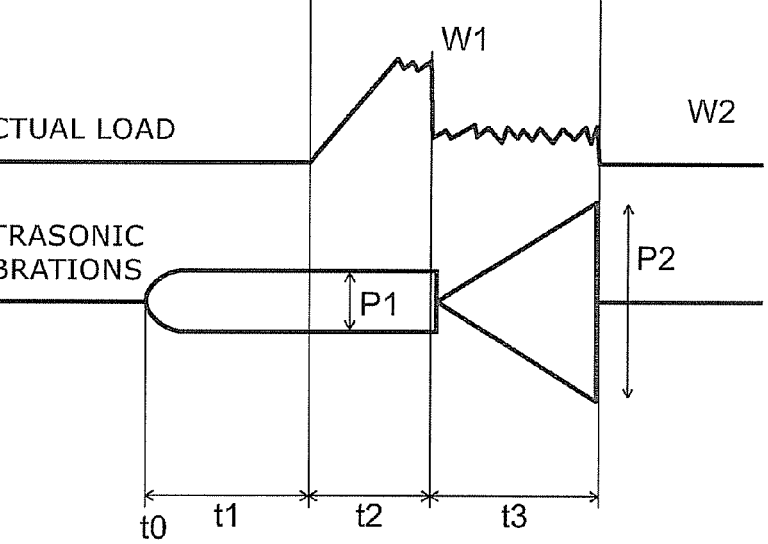

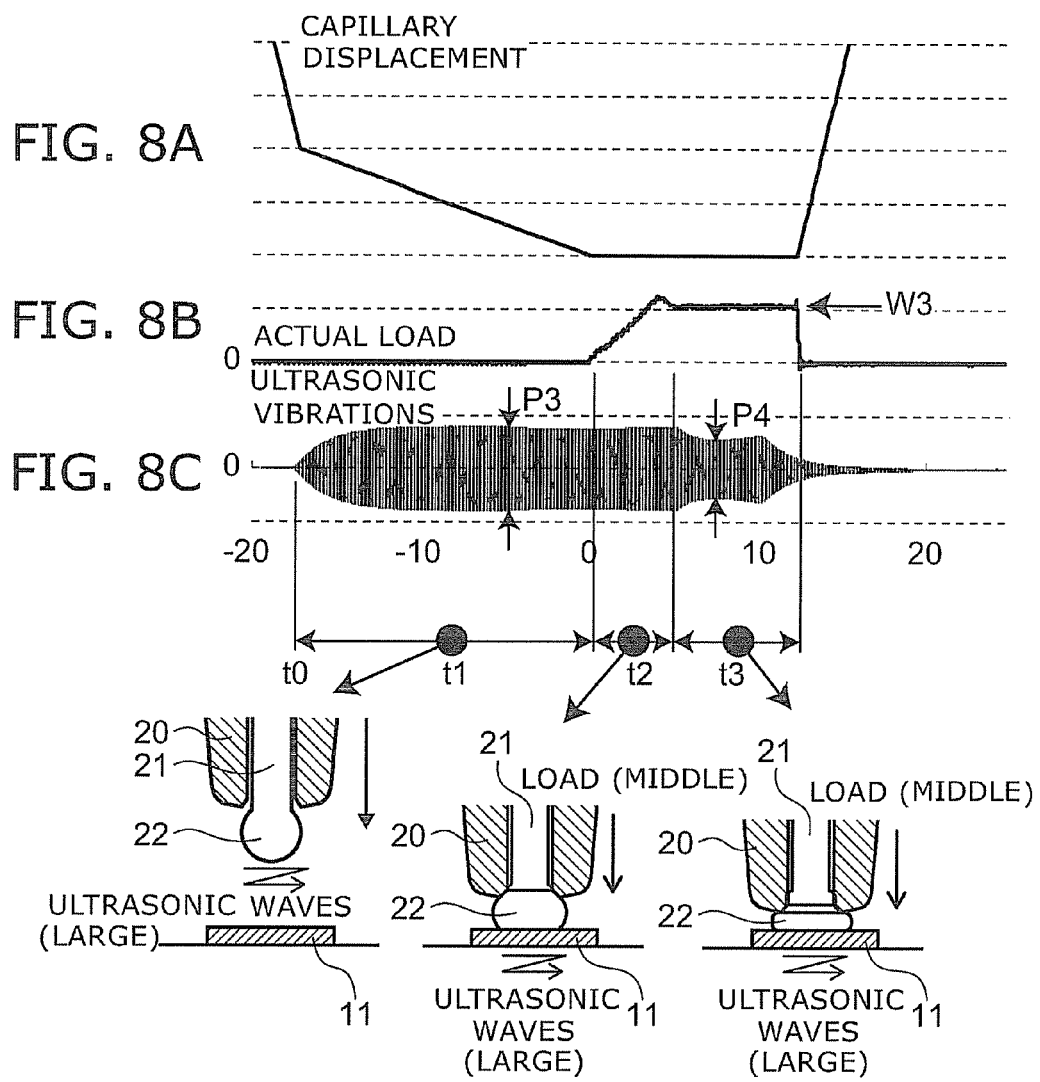

ULTRASONIC VIBRATION DIRECTION

WIRE BONDING METHOD

CROSS-REFERENCE TO RELATED APPLICATIONS

This application is based upon and claims the benefit of priority from the prior Japanese Patent Application No. 2008-272414, filed on Oct. 22, 2008; the entire contents of which are incorporated herein by reference.

BACKGROUND OF THE INVENTION

1. Field of the Invention

This invention relates to a bonding method to perform wire bonding to an electrode pad formed on a semiconductor chip, etc.

2. Background Art

Known wire bonding methods utilize ultrasonic vibrations to electrically connect electrode pads of semiconductor chips to leadframes, wiring substrates, other semiconductor chips, and the like (for example, JP-A 2004-241712 (Kokai)).

Although gold is often used for conventional bonding wire, the sudden rise in the price of gold particularly in recent years has increased the need to use wires of inexpensive copper or copper alloy. However, copper is considerably harder than gold. Therefore, when bonding a wire end portion to the electrode pad, it is necessary to increase the impact load of a ball of the wire end portion on the electrode pad to deform the ball enough to ensure the desired bonding strength. Thereby, concerns remain that wire bonding using copper unfortunately causes damage such as cracks of the electrode pad, semiconductor chip, etc., and discrepancies in which a portion of the electrode pad below the ball is pressed out from around the ball. Due to such problems, gold wires currently are used overwhelmingly as bonding wires even though copper is less expensive than gold.

SUMMARY OF THE INVENTION

According to an aspect of the invention, there is provided a bonding method of applying vibrations to a metal unit including copper while pressing the metal unit onto a bonding object to bond the metal unit to the bonding object, the method including: applying vibrations to the metal unit and bringing the metal unit into contact with the bonding object while applying the vibrations; gradually increasing a pressing load of the metal unit on the bonding object to a first pressing load; and reducing the pressing load to a second pressing load smaller than the first pressing load and gradually increasing an output power of the vibrations from a first output power to a second output power after the pressing load reaches the first pressing load, the first output power being applied during the first pressing load.

According to another aspect of the invention, there is provided a bonding method of applying vibrations to a metal unit including copper while pressing the metal unit onto a bonding object to bond the metal unit to the bonding object, the method including: applying vibrations to the metal unit and bringing the metal unit into contact with the bonding object while applying the vibrations; gradually increasing a pressing load of the metal unit on the bonding object to a first pressing load; and reducing the pressing load to a second pressing load smaller than the first pressing load and stopping applying the vibrations after the pressing load reaches the first pressing load, and then gradually increasing an output power of the vibrations to a second output power, the second output power being greater than a first output power applied during the first pressing load.

BRIEF DESCRIPTION OF THE DRAWINGS

FIGS. 6A to 6C are schematic views showing temporal changes of capillary displacement, a pressing load and an output power of the ultrasonic vibrations in a bonding method according to another embodiment;

FIGS. 7A to 7C are schematic views showing temporal changes of capillary displacement, a pressing load and an output power of the ultrasonic vibrations in a bonding method according to still another embodiment;

FIGS. 8A to 8F are schematic views showing temporal changes of capillary displacement, a pressing load and an output power of the ultrasonic vibrations, and states of bonding portions in main phases, in a bonding method according to a comparative example.

DETAILED DESCRIPTION OF THE INVENTION

Embodiments of the invention will now be described with reference to the drawings.

A bonding method according to an embodiment of the invention applies vibrations to a metal unit including copper while pressing the metal unit onto a bonding object to bond the metal unit to the bonding object. In particular, ultrasonic wire bonding that utilizes ultrasonic vibrations to bond bonding wire (hereinbelow also simply referred to as "wire") made of copper or an alloy including copper as the main component to an electrode pad formed on a semiconductor chip, etc., is described as an example in the embodiments hereinbelow.

Figures 1A, 1B, 1C, 1D, 1E, 1F:
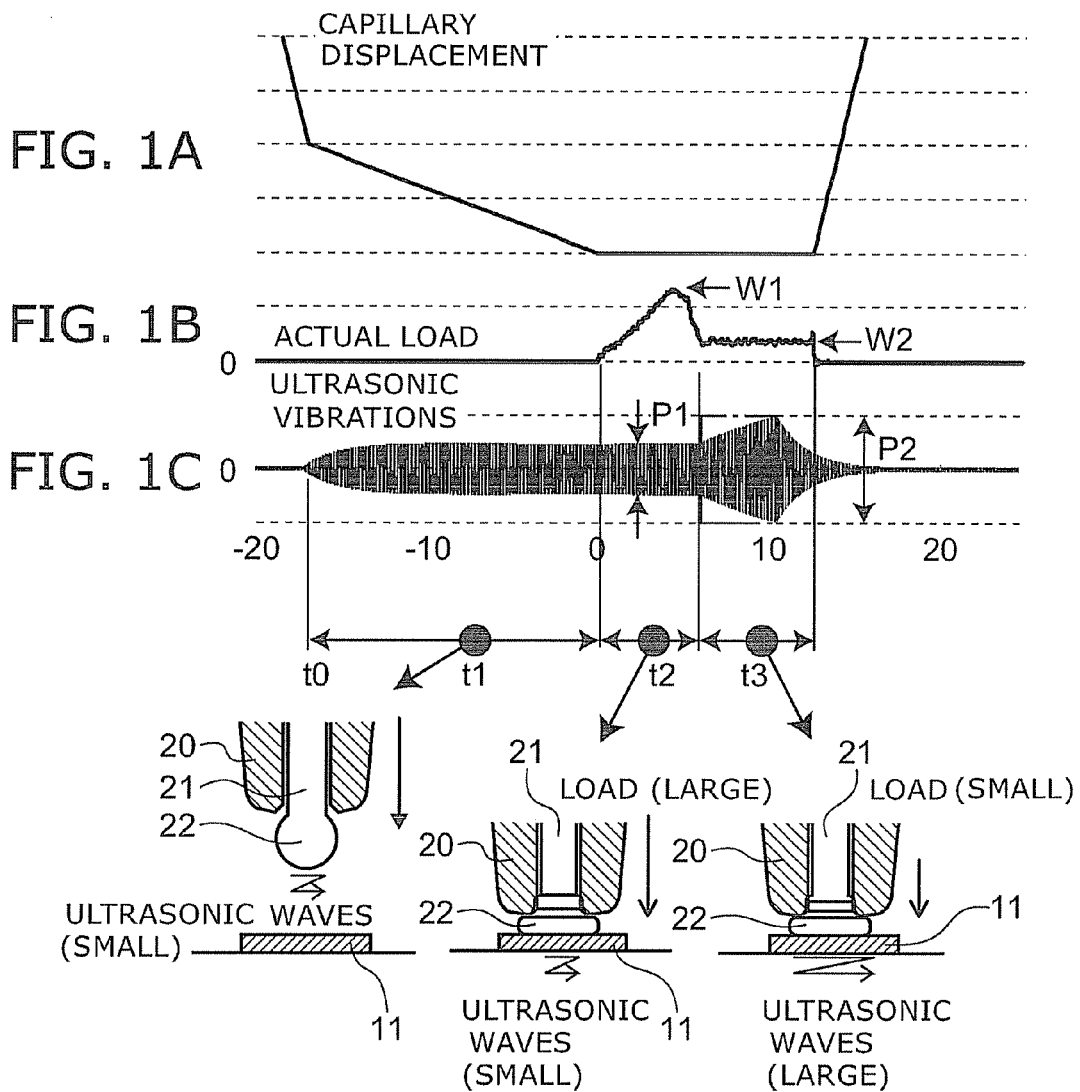
FIGS. 1A to 1F are schematic views showing temporal changes of capillary displacement, a pressing load and an output power of ultrasonic vibrations, and states of bonding portions in main phases, in a bonding method according to this embodiment.

As illustrated in FIG. 1D, a wire 21 passes through a holding tool, i.e., a hollow capillary 20. A tip portion of the capillary 20 is melted by a spark to form a ball. The formation of the ball 22 may be performed while blowing, for example, a gas containing hydrogen, etc., to prevent oxidization of the copper. For example, the diameter of the wire 21 may be 25 μm, and the diameter of the ball 22 may be 46 μm.

The capillary 20 is attached to a tip portion of a not-illustrated horn. Another end portion of the horn is coupled to an ultrasonic generator (ultrasonic vibrator). Ultrasonic vibrations generated by the ultrasonic generator are transmitted (applied) to the wire 21 via the horn and the capillary 20. The tip portion of the horn is vertically moveable by a drive apparatus such as a motor. Accordingly, the capillary 20 attached to the horn tip portion also is vertically moveable.

An ultrasonic wire bonding method according to this embodiment will now be described.

FIG. 1A illustrates the temporal displacement of the position of the capillary 20 in a vertical direction. A larger inclination of a straight line in FIG. 1A indicates a higher rate of descent or ascent of the capillary 20. FIG. 1B illustrates the temporal change of a pressing load of the ball 22 on an electrode pad (made of, for example, aluminum) 11, i.e., the bonding object. That is, this pressing load is the actual load experienced by the electrode pad 11 due to the ball 22. The pressure is applied to the ball 22 via the capillary 20. FIG. 1C illustrates the temporal change of an output power (or amplitude) of the ultrasonic vibrations of the ball 22 (or the contact surface between the ball 22 and the electrode pad 11).

First, at a time t0, the ultrasonic generator recited above is driven to apply ultrasonic vibrations to the ball 22 of the wire 21 via the horn and the capillary 20. At this time, the ball 22 is still vertically distal to the electrode pad 11 and does not contact the electrode pad 11 as illustrated in FIG. 1D.

The capillary 20 descends toward the electrode pad 11 while the ultrasonic vibrations recited above are applied. The ball 22 reaches and contacts the surface of the electrode pad 11 after an interval t1 elapses from the time t0 when the ultrasonic vibration application is started. After contacting, the pressing load of the ball 22 on the electrode pad 11 starts to increase gradually as illustrated in FIG. 1B. The load at this time is the impact load of the ball 22 impacting the electrode pad 11. In this embodiment, the load ramp-up after the ball 22 contacts the electrode pad 11 is controlled to be gradual by controlling the rate of descent of the capillary 20 to be relatively low.

Gold often used as conventional bonding wire is relatively soft, and the impact load of the ball impacting the electrode pad is increased to deform the ball to the desired diameter and press the ball onto the electrode pad. However, copper is harder than gold and therefore undesirably results in damage such as cracks of the electrode pad and the chip surface therebelow in the case where the electrode pad is impacted by a large impact load.

Therefore, in this embodiment, the ramp-up load after contact of the ball 22 is controlled to be gradual and a large load is not instantaneously applied to the electrode pad 11 as described above referring to FIG. 1B. Thereby, damage to the electrode pad 11 and portions therebelow is prevented.

After the ball 22 contacts the electrode pad 11, the load increases to a first pressing load W1. The first pressing load W1 has a magnitude necessary to deform the ball 22 to the desired diameter. In other words, in this embodiment, the pressing load is gradually increased to the first pressing load W1 after the ball 22 contacts the electrode pad 11, and the ball 22 deforms to the desired diameter as illustrated in FIG. 1E. For example, a ball 22 having a diameter of 46 μm prior to deformation (FIG. 1D) may have a diameter of 56 μm after deformation (FIG. 1E).

Because the ramp-up of the impact load between the ball 22 and the electrode pad 11 is gradual and the ball 22 is made of hard copper or copper alloy, the effects produced only by the load in this embodiment are insufficient to increase the contact force between the ball 22 and the electrode pad 11. Therefore, in this embodiment, ultrasonic vibrations are applied to the ball 22 prior to the contact between the ball 22 and the electrode pad 11, and the ball 22 is pressed onto the electrode pad 11 while applying the ultrasonic vibrations. Therefore, the contact force of the ball 22 onto the electrode pad 11 can be increased by supplementing a small pressing load with energy of ultrasonic vibrations even while preventing damage to the electrode pad 11 by using the small load.

The output power of the ultrasonic vibrations is maintained at a first output power P1 without fluctuating from the time t0 when the application of the vibrations is started through the interval t1 until the ball 22 contacts the electrode pad 11 and further during a subsequent interval t2.

The phase of the interval t2 is a phase in which the contact force between the ball 22 and the electrode pad 11 is increased to deform the ball 22 to the desired diameter. Although alloying (bonding) may occur partially between the ball 22 and the electrode pad 11 during this phase, bonding does not occur over the entire contact surface of the ball 22 and the electrode pad 11. In other words, the phase of the interval t2 is a phase in which the ball 22 is brought into contact with the electrode pad 11 over the desired surface area, gaps in the bonding portion are eliminated, and a state is obtained in which diffusion bonding of metal can be easily facilitated.

In the next phase, the ball 22 and the electrode pad 11 are bonded over the entire contact surface in the surface direction. To this end, the pressing load is decreased to a second pressing load W2 smaller than the first pressing load W1 while gradually increasing the output power of the ultrasonic vibrations from the first output power P1 to a second output power P2.

Specifically, the pressing load is decreased after the pressing load reaches the first pressing load W1. When the pressing load reaches the second pressing load W2 or immediately thereafter, the output power of the ultrasonic vibrations is gradually increased from the first output power P1 to the second output power P2.

The phase of an interval t3 has a smaller pressing load and a larger output power of the ultrasonic vibrations affecting the bonding portion compared to those of the phase of the interval t2, where the phase of the interval t2 is from when the ball 22 contacts the electrode pad 11 and the pressing load occurs until the output power of the ultrasonic vibrations increases from P1 (the state illustrated in FIG. 1E), and the phase of the interval t3 is from the start of the increase of the output power of the ultrasonic vibrations from P1 while the pressing load is maintained at the second pressing load W2 until the pressing load subsequently decreases to zero (the state illustrated in FIG. 1F).

Thus, the ball 22 and the electrode pad 11 are completely bonded during the phase of the interval t3 in which the output power of the ultrasonic vibrations is gradually increased from P1 to P2 while the pressing load is maintained at the second pressing load W2 reduced from the first pressing load W1. During this bonding, the ultrasonic vibrations greatly contribute; and because the pressing load is small, the ball 22 does not deform further and is maintained at the same diameter as that of the phase of the interval t2. Thereby, so-called "splashing" discrepancies of the electrode pad 11 described below can be avoided.

A command to stop applying the ultrasonic vibrations is issued in the latter half of the interval t3 in which the second pressing load W2 is maintained, and the output power of the ultrasonic vibrations decreases from the second output power P2 toward zero. The capillary 20 is lifted as the output power of the ultrasonic vibrations decreases, and the pressing load decreases from the second pressing load W2 to zero. However, the pressing load may be reduced from the second pressing load W2 to zero simultaneously with the decrease of the output power of the ultrasonic vibrations from P2.

The ball 22 is bonded to the electrode pad 11, and the capillary 20 therefore is lifted while letting out the wire 21 from the tip opening of the capillary 20. The capillary 20 moves above another bonding object (lead of a leadframe, pad of a wiring substrate, pad of another semiconductor chip, etc.) and performs so-called wedge bonding without forming a ball. Then, the capillary 20 ascends, and a not-illustrated clamp closes to cut the wire 21. Thereby, the electrode pad 11 of the semiconductor chip is electrically connected via the wire 21 to the leadframe, wiring substrate, other semiconductor chip, etc.

A comparative example for this embodiment will now be described referring to FIGS. 8A to 8F.

FIG. 8A illustrates the temporal displacement of the position of the capillary 20 of the comparative example in a vertical direction. FIG. 8B illustrates the temporal change of the pressing load of the ball 22 on the electrode pad 11 of the comparative example (the actual load experienced by the electrode pad 11 due to the ball 22). FIG. 8C illustrates the temporal change of the output power (or the amplitude) of the ultrasonic vibrations of the ball 22 (or the contact surface between the ball 22 and the electrode pad 11). The state of the ball 22 in each of the intervals t1, t2, and t3 is schematically illustrated in FIGS. 8D, 8E, and 8F, respectively.

In this comparative example, the pressing load is gradually increased after the ball 22 contacts the electrode pad 11 to reach a pressing load W3. The pressing load W3 is maintained until the bonding between the ball 22 and the electrode pad 11 is completed. The pressing load W3 is at least twice the second pressing load W2 of this embodiment described above and is slightly smaller than the first pressing load W1.

After the application of the ultrasonic vibrations is started at the time t0, an output power P3 is maintained during the intervals t1 and t2. The output power is reduced to an output power P4 smaller than P3 during the interval t3 in which the pressing load W3 is maintained. P3 is larger than P1 of this embodiment described above and slightly smaller than P2. P4 is slightly larger than P1.

Figure 9A:
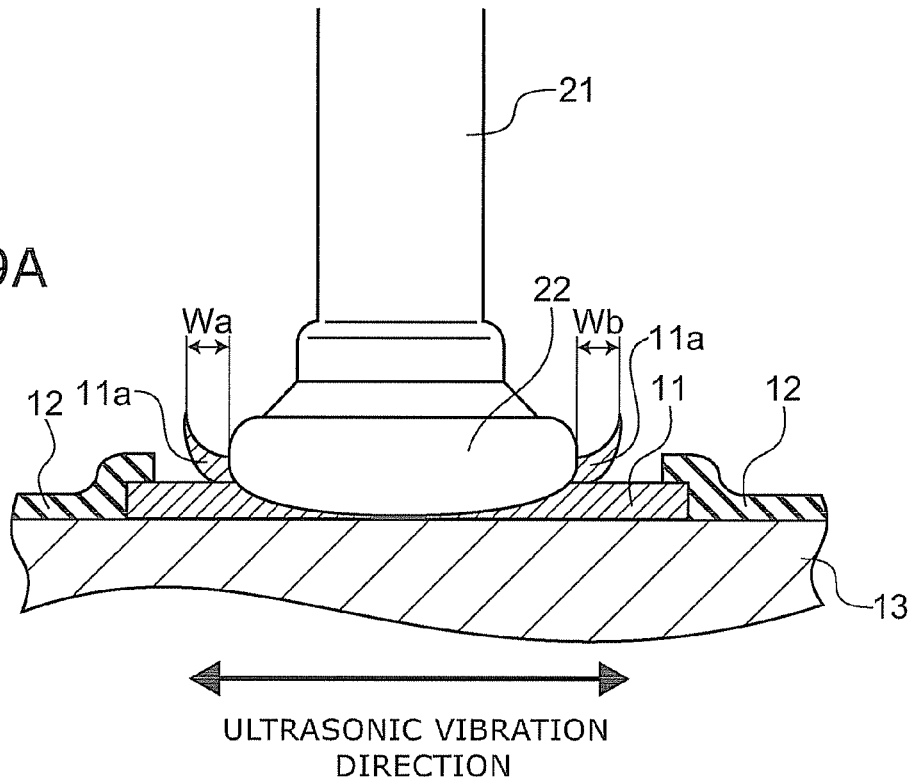
FIG. 9A is a schematic view for describing "splashing" of the electrode pad.
Figure 9B:
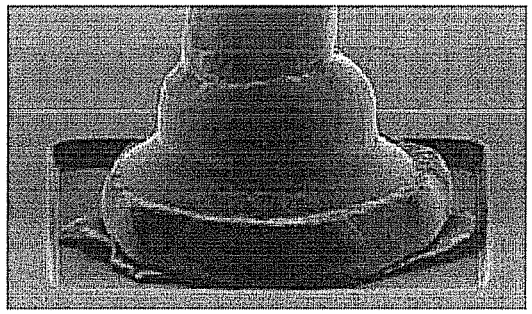
FIG. 9B is an observed electron microscope image of the bonding portion where "splashing" occurs.

In this comparative example, the relatively large load W3 is maintained until completion of the bonding after the pressing load is ramped up. Thereby, the so-called splashing discrepancies of the electrode pad 11 undesirably occur as illustrated in FIGS. 9A and 9B. FIG. 9A schematically illustrates the state where splashing of the electrode pad 11 has occurred. FIG. 9B is an electron microscope image of the same state. The electrode pad 11 is formed on a surface of a semiconductor chip 13. The surface of the semiconductor chip 13 is covered by a dielectric protective film 12. The surface of the electrode pad 11 other than the peripheral portion is exposed from the dielectric protective film 12.

"Splashing" refers to the discrepancy where the pressing load due to the ball 22 during wire bonding becomes excessive and a portion 11a of the electrode pad 11 below the ball 22 is pressed up and out from around the ball 22. The portion 11a is pressed out from the electrode pad 11 and extends or spreads out in the vibration direction due to the application of the ultrasonic vibrations. For example, in the case of a so-called fine-pitch product having a pitch between the electrode pads 11 of 60 μm or less, the portion 11a may be pressed out to reach the adjacent electrode pad and undesirably cause a short defect between the electrode pads. Also, there is a risk of poor reliability when splashing occurs because the electrode pad 11 becomes thin proximal to the central portion thereof.

Conversely, as described above in this embodiment referring to FIGS. 1A to 1F, the ball 22 is deformed to the desired diameter in the phase of the interval t2; and then in the next bonding phase, the output power of the ultrasonic vibrations is increased from P1 to P2 after reducing the pressing load from the first pressing load W1 to the second pressing load W2. Splashing of the electrode pad 11 can be suppressed by reducing the pressing load, thereby preventing effects of an excessive pressing load during the bonding phase. The ultrasonic vibrations mainly contribute during the bonding phase, and the bonding of the ball 22 and the electrode pad 11 is facilitated by friction caused by relative vibrations between the ball 22 and the electrode pad 11 in the surface direction.

Here, in the case where bonding is performed with settings such that the output power of the ultrasonic vibrations is abruptly changed from P1 to P2 (at a ramp-up angle of 90° or close thereto) as illustrated by the single dot-dash line in FIG. 1C, splashing of the electrode pad 11 undesirably occurs due to a large amount of energy instantaneously affecting the bonding portion even in the case where the pressing load is reduced to the second pressing load W2. Accordingly, it is important that the output power of the ultrasonic vibrations is gradually increased from P1 to P2.

According to this embodiment described above, wire bonding using a wire made of copper or an alloy having copper as the main component can provide a bond having high reliability without the occurrence of problems affecting such wire bonding such as electrode pad splashing and damage to the electrode pad and/or semiconductor chip and realize cost reductions by using a wire made of copper or an alloy having copper as the main component which is less expensive than gold. Moreover, because splashing does not occur, wire bonding of electrode pads having a finer pitch (e.g., 60 μm or less) can be realized without the occurrence of shorts between pads.

Figure 2:
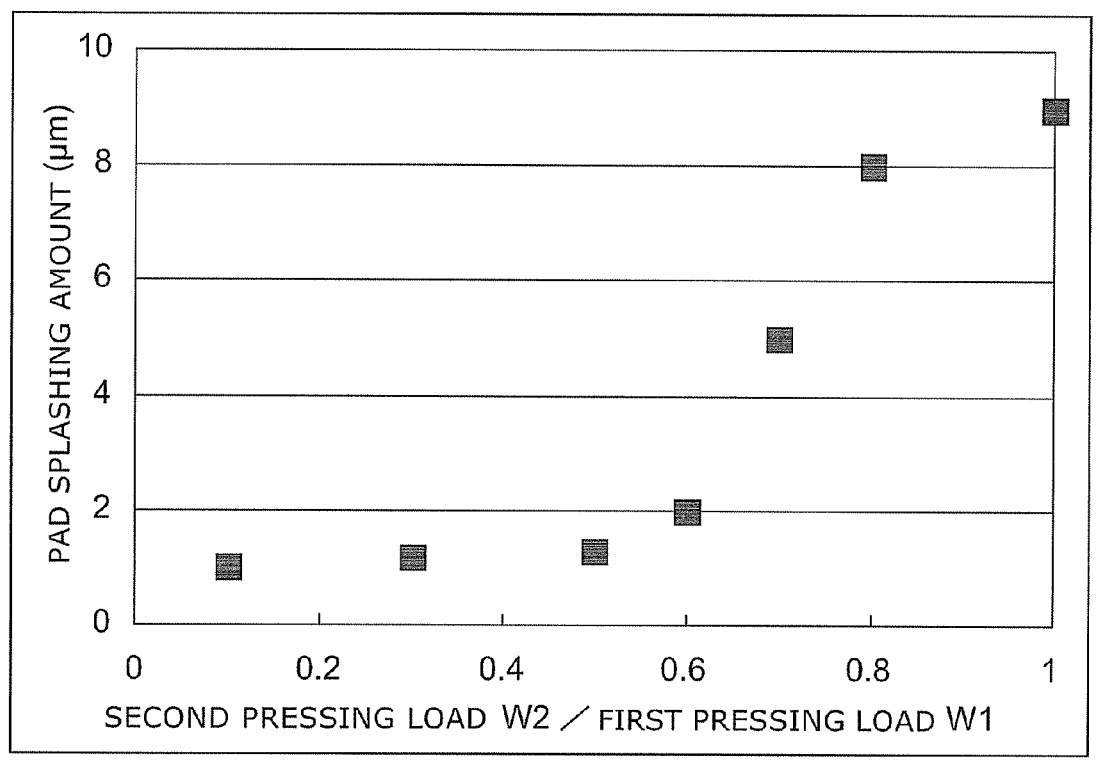
FIG. 2 is a graph showing the relationship between (second pressing load W2/first pressing load W1) in FIG. 1B and a pad splashing amount.

The inventor performed wire bonding for various ratios (W2/W1) of the second pressing load W2 to the first pressing load W1 of FIG. 1B and measured the electrode pad splashing amount (μm) for multiple samples at each ratio. The results are illustrated in FIG. 2. The splashing amount (μm) is the total Wa+Wb, where Wa and Wb are lengths in the ultrasonic vibration direction of the portions 11a of splashing of the electrode pad 11 illustrated in FIG. 9A.

The results of FIG. 2 show that the splashing amount increases as W2/W1 increases from 0.5 toward 1; there is little change in the splashing amount as the second pressing load W2 is reduced for a W2/W1 of 0.5 and less; and the splashing amount is suppressed to a level causing no practical problems for a W2/W1 of 0.5 and less. Accordingly, it is desirable that the magnitude of the second pressing load W2 is greater than zero and not greater than one-half of the magnitude of the first pressing load W1. However, too small of a second pressing load W2 results in poor peel strength of the bonding portion. Therefore, it is necessary to appropriately set a lower limit of the second pressing load W2 in a range such that the peel strength is sufficient.

Figure 3:
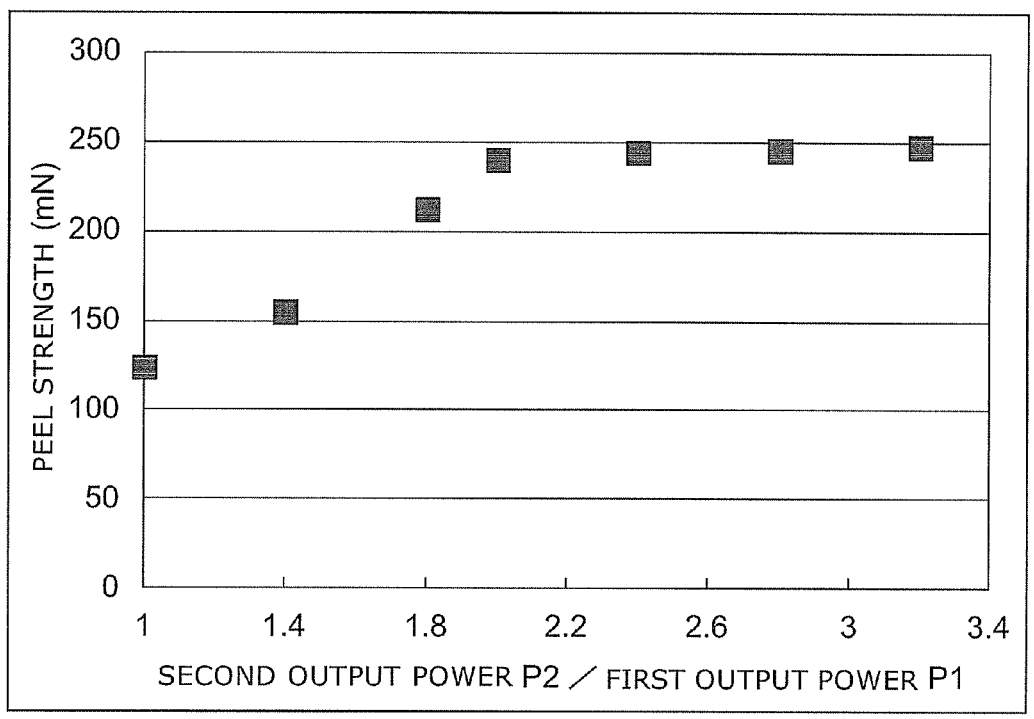
FIG. 3 is a graph showing the relationship between (second output power P2/first output power P1) in FIG. 1C and peel strength of bonding portions.

Here, "peel strength" refers to the force in a horizontal direction causing the ball bonded to the electrode pad to peel from the electrode pad. The relationship between the peel strength (mN) and the ratio (P2/P1) of the second output power P2 to the first output power P1 of the ultrasonic vibrations described above was ascertained. The results are illustrated in FIG. 3.

In the case where the magnitudes of P2 and P1 are equivalent, the bonding is insufficient and the peel strength is poor. As P2 is increased higher than P1, the peel strength also increases. The results of FIG. 3 show that increasing P2 causes little change in the peel strength when P2 is twice P1 or higher; and the necessary peel strength is ensured when P2 is twice P1 or higher. However, splashing occurs when P2 is too high. Therefore, it is necessary to appropriately set an upper limit of P2 in a range such that the splashing amount is not problematic.

Figure 4A:
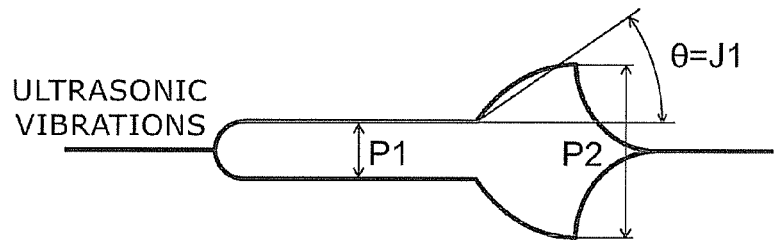
FIGS. 4A to 4C are schematic views showing the variation of a ramp-up angle θ during increase of the output power of ultrasonic vibrations from P1 to P2.
Figure 4B:
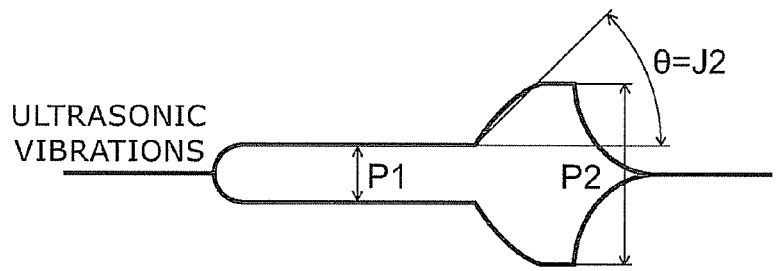
Figure 4C:
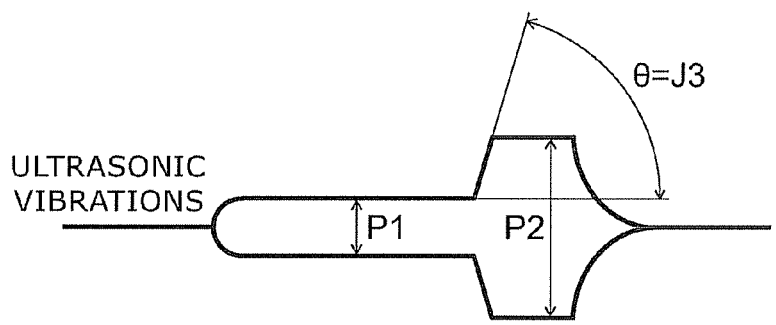

A ramp-up angle θ was defined as the ramp-up angle of the output power of the ultrasonic vibrations increasing from the first output power P1 to the second output power P2 as illustrated in FIGS. 4A to 4C. The relationship between the angle θ and the splashing amount (Wa+Wb of FIG. 9A) was ascertained. The results are illustrated in FIG. 5.

As the ramp-up angle θ increases, the output power of the ultrasonic vibrations transitions from P1 to P2 in a shorter amount of time (more abruptly). FIG. 4A illustrates the case where θ=J1=about 35°. FIG. 4B illustrates the case where θ=J2=about 45°. FIG. 4C illustrates the case where θ=J3=about 75°.

Figure 5:
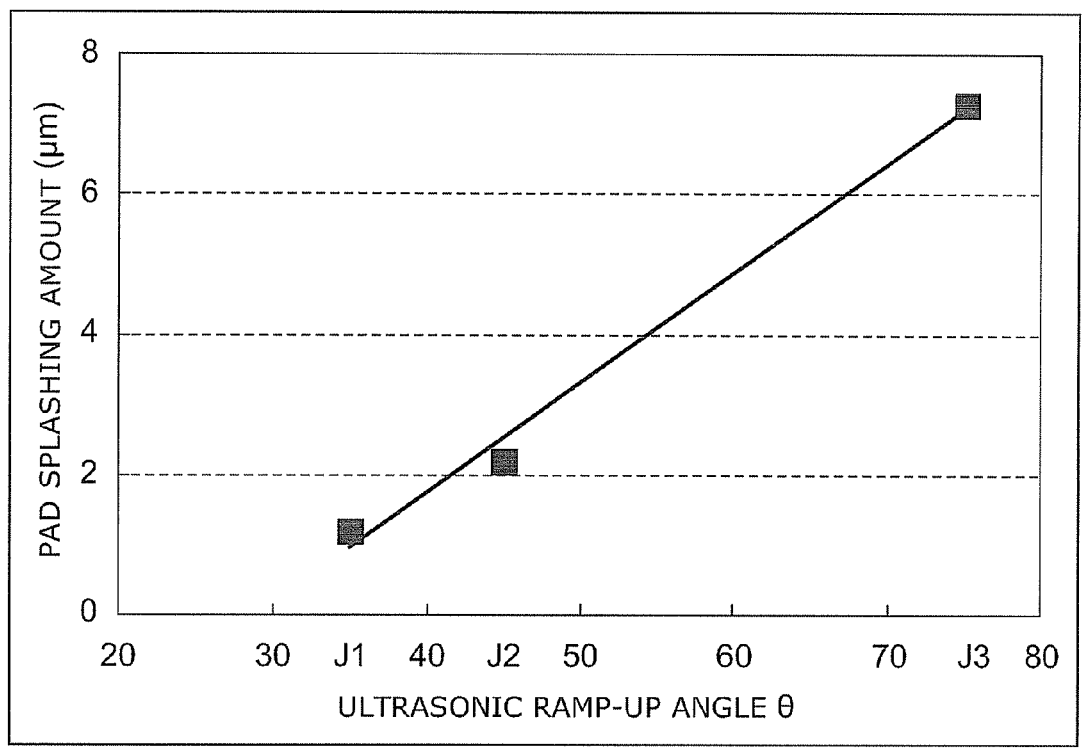
FIG. 5 is a graph showing the relationship between the ramp-up angle θ shown in FIGS. 4A to 4C and the pad splashing amount.

The results of FIG. 5 show that as the ramp-up angle θ of the output power of the ultrasonic vibrations from P1 to P2 decreases, that is, as the output power transitions from P1 to P2 more gradually, the splashing amount decreases.

The inventor investigated the timing to start increasing the output power of the ultrasonic vibrations from P1 to P2. The waveform of the pressing load illustrated in FIG. 1B is not a command signal value but the actual load which depends on the state of the bonding surface, etc. The pressing load does not necessarily transition (decrease) immediately from the first pressing load W1 to the second pressing load W2. In the case where the increase of the ultrasonic vibrations is started partway through the transition from the first pressing load W1 to the second pressing load W2 (particularly in the region near the first pressing load W1), the splashing recited above may occur.

Accordingly, it is desirable to wait for the pressing load to reach the second pressing load W2 before starting the increase of the output power of the ultrasonic vibrations, that is, to start the increase of the output power when the second pressing load W2 is reached or after the second pressing load W2 is reached. By performing such a control, the ultrasonic vibrations can be reliably prevented from exceeding P1 while the pressing load is greater than the second pressing load W2; the splashing recited above can be prevented; and the reliability can be increased more.

The length relationship between the interval t2 and the interval t3 is not problematic in regard to obtaining the effects described above, where the pressing load is changed to W1 and the output power of the ultrasonic vibrations is maintained at P1 during the interval t2, and the pressing load is maintained at W2 and the output power of the ultrasonic vibrations is changed to P2 during the interval t3. However, the interval t3 is an interval for bonding; and therefore, the interval t3 is often insufficient to obtain a bond of sufficient strength in the case where the interval t3 is not greater than the interval t2 in which the ball is deformed. Although it is possible to use a relatively long interval t2, it is a waste of time to maintain the state of the interval 2 after the ball has been deformed to the desired diameter, and the efficiency decreases. Therefore, it is favorable that t2<t3.

FIGS. 6A to 6C are timing charts similar to those of FIGS. 1A to 1C of an ultrasonic wire bonding method according to another embodiment of the invention.

The phase of the interval t1 from the time t0 when the ultrasonic vibrations are applied to the ball prior to contacting the electrode pad and the phase of the interval t2 are similar to those of the embodiment recited above illustrated in FIGS. 1A to 1C.

In this embodiment, the application of the ultrasonic vibrations is stopped (the output power is reduced from P1 to zero) after reducing the pressing load from the first pressing load W1 to the second pressing load W2, and then the output power is gradually increased to the second output power P2. Specifically, the decrease of the output power of the ultrasonic vibrations from P1 starts after the interval t2 elapses, and the output power reaches zero when the interval t3 has elapsed from the start of the decrease. Then, similarly to the embodiment recited above, the output power of the ultrasonic vibrations is gradually increased from zero to the second output power P2 while the pressing load is maintained at the second pressing load W2, and the ball and the electrode pad are bonded.

In this embodiment, the output power of the ultrasonic vibrations is reduced from P1 to zero once partway through the increasing transition from P1 to P2. Thereby, the ultrasonic vibrations can be reliably prevented from undesirably exceeding P1 while the pressing load is relatively large at a stage prior to dropping to the second pressing load W2; the splashing recited above can be reliably prevented; and the reliability can be increased more.

FIGS. 7A to 7C are timing charts similar to those of FIGS. 1A to 1C of an ultrasonic wire bonding method according to yet another embodiment of the invention.

Also in this embodiment, similarly to the embodiment recited above illustrated in FIGS. 6A to 6C, the output power of the ultrasonic vibrations is reduced from P1 to zero once partway through the increasing transition from P1 to P2. Thereby, the ultrasonic vibrations can be reliably prevented from undesirably exceeding P1 while the pressing load is relatively large at a stage prior to dropping to the second pressing load W2; the splashing recited above can be reliably prevented; and the reliability can be increased more.

Although the output power of the ultrasonic vibrations drops from P1 immediately to zero in this embodiment, it is easier to control the output power as illustrated in FIGS. 6A to 6C to gradually decrease from P1 to zero.

Hereinabove, exemplary embodiments of the invention are described with reference to specific examples. However, the invention is not limited thereto. Various modifications are possible based on the technical spirit of the invention.

The bonding object is not limited to an electrode pad of a semiconductor chip, and may include a pad and/or wiring of a wiring substrate, a lead of a leadframe, etc. Further, the invention can bond a metal unit including copper to a softer bonding object without the occurrence of damage or the splashing described above; and the invention is not limited to the wire bonding described in the exemplary embodiments recited above. The invention is effective for bonding, for example, a component including bumps such as a flip chip package, etc., to bonding objects via the bumps.

The invention claimed is:

1. A wire bonding method of applying vibrations to a tip portion of a copper wire while pressing the tip portion of the copper wire onto a bonding object to bond the tip portion of the copper wire to the bonding object, the method comprising:

applying vibrations to the tip portion of the copper wire prior to a contact between the tip portion and the bonding object, and bringing the tip portion of the copper wire into contact with the bonding object while applying the vibrations;

gradually increasing a pressing load of the tip portion of the copper wire on the bonding object to a first pressing load with a first output power of the vibrations greater than zero using a capillary;

reducing the pressing load to a second pressing load smaller than the first pressing load and gradually increasing an output power of the vibrations from the first output power to a second output power after the pressing load reaches the first pressing load; and after bonding the tip portion of the copper wire to the bonding object, moving the capillary above another bonding object and bonding the copper wire to the other bonding object.

2. The method according to claim 1, wherein a magnitude of the second pressing load is greater than zero and not greater than one-half of a magnitude of the first pressing load.

3. The method according to claim 1, wherein an increase of an output power of the vibrations starts when the pressing load reaches the second pressing load.

4. The method according to claim 1, wherein an increase of an output power of the vibrations starts after the pressing load reaches the second pressing load.

5. The method according to claim 1, wherein the tip portion of the copper wire is a ball.

6. The method according to claim 1, wherein the tip portion of the copper wire is deformed in a first phase that gradually increases the pressing load to the first pressing load while maintaining the output power at the first output power.

7. The method according to claim 6, wherein the tip portion of the copper wire is not deformed in a second phase more than in the first phase, the second phase increasing the output power to the second output power while maintaining the pressing load at the second pressing load.

8. The method according to claim 1, wherein the second output power is not less than twice the first output power.

9. The method according to claim 1, wherein an interval of a second phase is longer than an interval of a first phase, the first phase gradually increasing the pressing load to the first pressing load while maintaining the output power at the first output power, the second phase changing the output power to the second output power while maintaining the pressing load at the second pressing load.

10. The method according to claim 1, wherein the vibrations include ultrasonic vibrations.

* * * * *